United States Patent [19]
Dooley et al.

[11] Patent Number: 5,399,100
[45] Date of Patent: Mar. 21, 1995

[54] TRANSMISSION WIRE CONNECTOR ASSEMBLIES

[75] Inventors: Andrew P. C. Dooley; Derec Sheals, both of Orpington, England

[73] Assignee: A.C. Agerton Limited, Kent, Great Britain

[21] Appl. No.: 154,161

[22] Filed: Nov. 17, 1993

Related U.S. Application Data

[62] Division of Ser. No. 950,609, Sep. 24, 1992, abandoned.

[30] Foreign Application Priority Data

Sep. 28, 1991 [GB] United Kingdom ............... 9120612

[51] Int. Cl.⁶ .......................................... H01R 11/18
[52] U.S. Cl. .................................. 439/482; 439/188; 200/51.09
[58] Field of Search ............... 439/188, 912, 482, 924, 439/521, 936, 488, 489; 200/51.09, 51.10

[56] References Cited

U.S. PATENT DOCUMENTS

| | | | |
|---|---|---|---|
| 3,522,576 | 8/1970 | Cairns | 439/359 |
| 3,610,830 | 10/1971 | Daleiden et al. | 200/51.09 |
| 4,426,558 | 1/1984 | Tanaka et al. | 200/51.09 |
| 4,600,261 | 7/1986 | Debbaut. | |
| 4,623,207 | 1/1987 | Debbaut. | |
| 5,128,501 | 7/1992 | Bilbao Urouiola | 200/51.09 |
| 5,140,746 | 8/1992 | Debbaut | 29/855 |

Primary Examiner—Daniel W. Howell
Assistant Examiner—Hien D. Vu
Attorney, Agent, or Firm—Kinney & Lange

[57] ABSTRACT

A transmission wire connector assembly incorporating a live contact test access position comprises a recess within the body of the assembly into which a connector extends, the recess being arranged to contain a non-conductive elastic self-healing sealant gel for providing a seal of the live connector with respect to the environment; and an electrically conductive contact member arranged to be disposed at least partially within the recess but normally held separated from the live connector and therefore non-live; the contact member being so disposed and arranged that upon applying a test probe thereto the contact member is moved into contact with the live connector to enable testing thereof to take place, the contact member being so arranged that upon removal of the probe the contact member returns to its normal position separated from the live connector.

11 Claims, 6 Drawing Sheets

TRANSMISSION WIRE CONNECTOR ASSEMBLIES

This is a divisional of application Ser. No. 07/950,609, filed Sep. 24, 1992, now abandoned. Priority of the prior application is claimed pursuant to 35 USC §120.

BACKGROUND OF THE INVENTION

This invention relates to transmission wire connector assemblies, and more particularly, although not exclusively, to connector assemblies for linking telecommunication wires together, particularly lines from a telecommunications exchange to lines to subscribers to the telecommunication system.

It is known to provide such assemblies in which a plurality of connectors, having line insulation penetration clips, are connected at one end to lines from a telecommunications exchange. Lines leading to the telecommunications subscribers are then connectable at the other end of the connectors.

In such an arrangement it has been proposed to provide test access positions by means of which the correct and adequate connection between a connector and the exchange line can be tested. The problem with such test access positions is of attempting to protect the connector from corrosion whilst at the same time enabling easy and regular access for test probes or clips.

It has previously been proposed to encapsulate the connectors in grease, or in an elastic self-healing sealant (sometimes known as a "gel"). The latter is preferable to grease in that whereas grease does not regain, after disturbance, its original disposition about the connector, so that the connector can become readily exposed and subject to corrosion, the latter technique involves the use of a material which will return elastically to its original position protecting the connector.

However even the use of gels can suffer from the disadvantage that after repeated use with probes or clips, the gel becomes depleted by pick-up from the probes or clips so that the connectors become exposed and the seal compromised.

It is an object of the present invention to overcome or at least substantially reduce this problem.

SUMMARY OF THE INVENTION

In accordance with the present invention there is provided a transmission wire connector assembly incorporating a live contact test access position comprising a recess within the body of the assembly into which a connector extends, the recess being arranged to contain a non-conductive elastic self-healing sealant gel for providing a seal of the live connector with respect to the environment; and an electrically conductive contact member arranged to be disposed at least partially within the recess but normally held separated from the live connector and therefore non-live; the contact member being so disposed and arranged that upon applying a test probe or clip thereto the contact member is moved into contact with the live connector to enable testing thereof to take place, the contact member being so arranged that upon removal of the probe the contact member returns to its normal position separated from the live connector.

Testing contact of the testing probe with the contact member may be by movement of the probe through the self-healing elastic sealant gel to the side of the contact member remote from the live connector. In this case it is possible to ensure that depletion of the gel through repeated use of a testing probe only occurs adjacent to the side of the normally non-live contact member remote from the live connector, leaving the live connector continually encapsulated and protected by the gel.

In practice, the live connector may comprise an intermediate live connector connected to the principal live connector at each connection position.

In a preferred embodiment the contact member may comprise a strip like member anchored to a wall of the recess and having a generally "U" section immersed in the gel, one arm of the contact lying adjacent to the live connector whereby upon engaging a testing probe with the contact, the arm is moved towards and engages the live connector whereby the test probe can perform its test function. With such an arrangement it will be appreciated that the gel surrounding the live contact is not depleted by the probe, and any depletion upon removal of the probe of gel onto the probe itself will occur within the confines of the "U" shaped contact member thereby not compromising in any way the sealing of the live connector.

BRIEF DESCRIPTION OF THE DRAWINGS

In order that the invention may be more readily understood one embodiment thereof will now be described by way of example with reference to the accompanying drawings in which.

DETAILED DESCRIPTION OF THE PREFERRED EMBODIMENT

Figure 1:
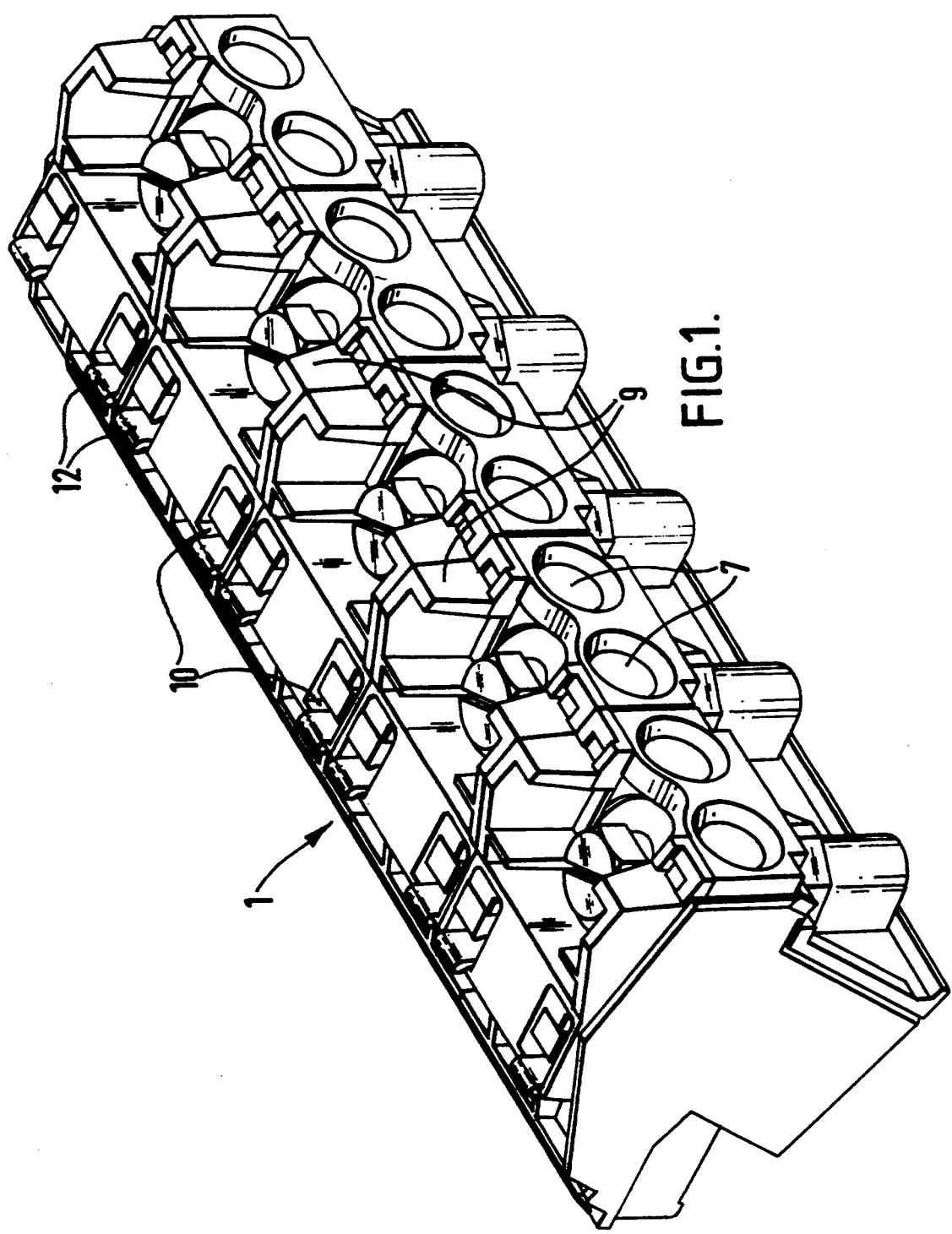
FIG. 1 is an isometric view from one side of a telecommunication connector assembly according to the invention.
Figure 2:
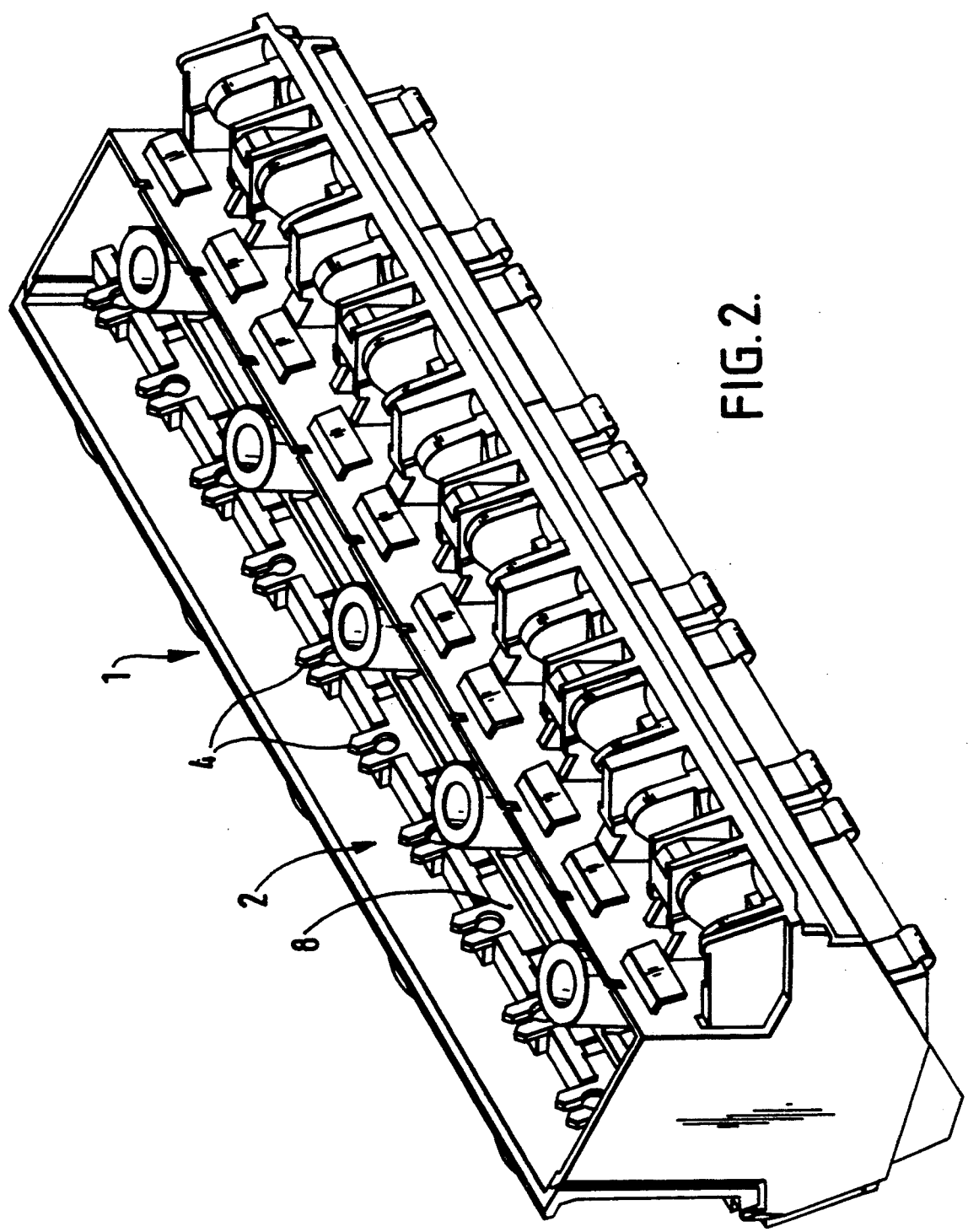
FIG. 2 is an isometric view of the assembly of FIG. 1 from the other side.
Figure 3:
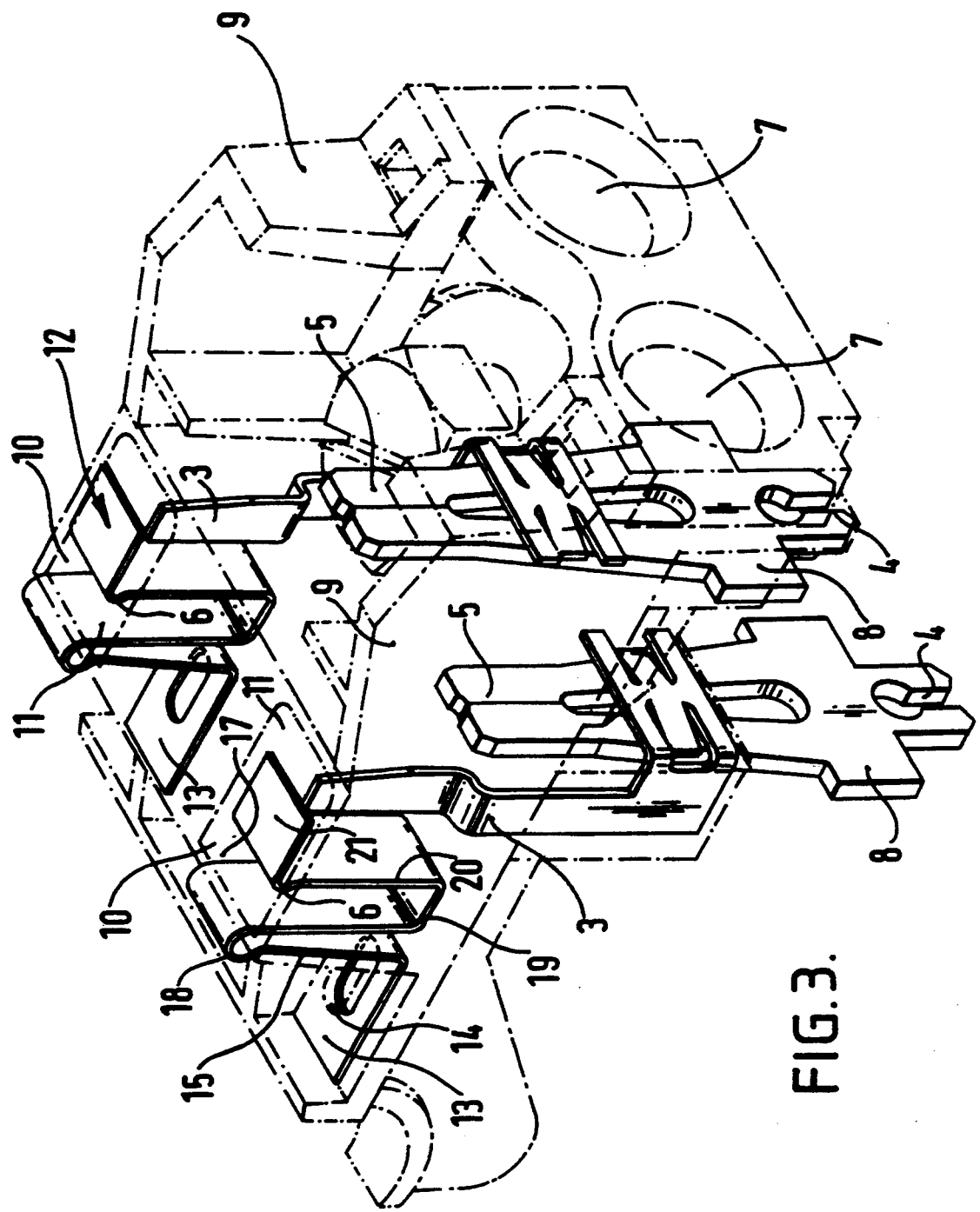
FIG. 3 is an isometric cut away view of part of the assembly of FIG. 1.
Figure 4:
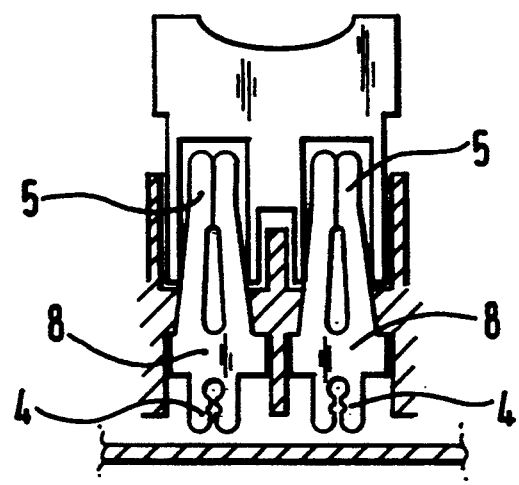
FIG. 4 schematically illustrates a pair of connectors of the assembly of FIG. 1 showing the insulation penetration clips at top and bottom.

Referring now to FIGS. 1 to 7 of the drawings it will be seen that the connector assembly 1 comprises in the usual way a lower part 2 to which the exchange lines (not shown) from a telecommunications exchange pass and where they are linked with connector members 8 having insulation penetration clips 4 at their lower end. At their upper end the connector members 8 are arranged for connection, again by means of insulation penetration clips 5 to telecommunications subscriber lines (not shown) fed in via ports 7 associated with hinged blocks 9 arranged to move downwardly, after incorporation of the appropriate subscriber lines in ports 7, to create clip connection with the connector members 8.

It is to be seen that recesses 10 are located in the pivotable blocks 9 into each of which extends the upper end of an intermediate connector member 3 attached to a connector member 8. It is to be noted that alternatively the connector member 8 can be designed and shaped to obviate the need for an intermediate connector member.

Each recess 10 is filled with a gel 11 of elastic self-healing sealant gel of a characteristic of generally known kind to provide a seal against the environment for the live connector member.

Also disposed partially within each recess 10 is a electrically conductive spring metal contact member 12. As can be seen this is fastened at one end 13 outside the recess 10 to the wall of the block by means of a stud 14, and has a portion 15 passing up the outer wall 16 of the recess 10 and then down the inner wall 17 so as to lie thereagainst. It will be observed that at the upper end of the wall the spring contact 12 is formed into a curve 18 thereby defining a turning position for the spring contact 12. The spring contact member 12 then has a base portion 19 lying adjacent to the base of the recess 10, and a further upstanding part 20 leading to a portion 21 overlying the connector 8. A further curve 6 (FIG. 3) may be provided between part 20 and portion 21 to aid retention of a probe clip when used. It will be appreciated that the contact member 12 is in the form of a strip, so that the overlying portion 21 does in fact cover over the intermediate connector member 3. It will be noted that the overlying portion rests approximately at the upper surface of the gel 11 within the recess 10, and indeed adjacent the upper level of the recess 10 itself.

Figure 6:
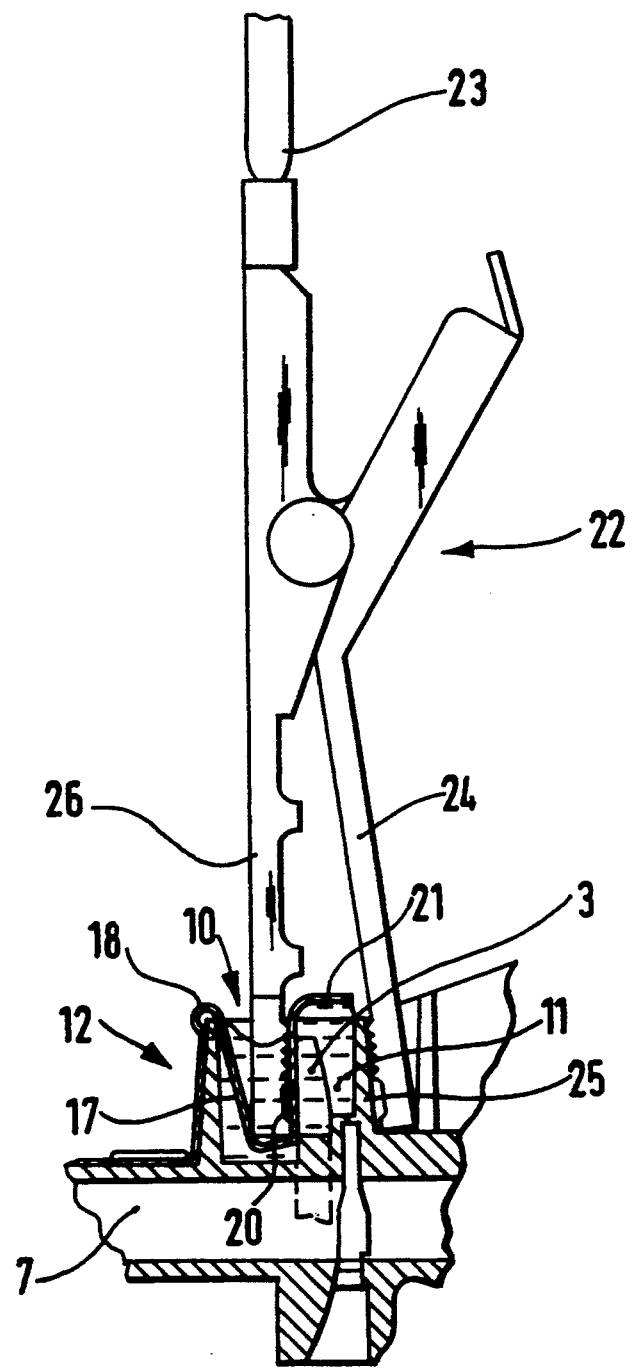
FIG. 6 shows the test access position of FIG. 5 undergoing test.

As can be seen from FIG. 6 the test access position enables the use of a test probe for testing purposes with respect to a live connector. In the arrangement illustrated in FIG. 6 the probe comprises a crocodile type test clip 22 connected at its outer end 23 in a manner not shown to appropriate testing equipment.

One arm 24 of the crocodile clip engages an outer side wall 25 of the recess, whilst the other arm 26 engages the free upstanding wall 20 of the spring contact member 12 and, by the spring action of the arms 24, 26 of the crocodile clip 22, pulls it into contact with the intermediate connector member 3 by resiliently turning the contact about its turning point 18. It will be observed that, by its elastic nature, the sealant gel 11 adjacent to the connector member 3 is moved, by the compression from the arm 26 of the spring clip 22, out of the recess 10 itself below the overlying portion 21 of the spring contact 12.

Figure 7:
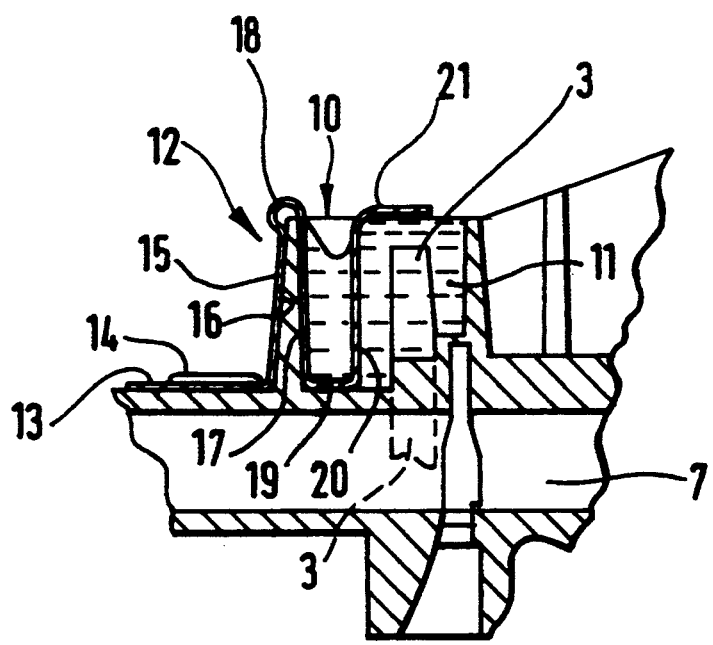
FIG. 7 shows the test access position of FIG. 5 after undergoing tests.

Upon completion of testing and removal of the crocodile clip 22 the position shown in FIG. 7 is reached where the moving spring contact 12 moves, by its own resilience, to its normal position out of contact with the intermediate connector member 3 and therefore to a non-live state. The gel 11 disposed about the live connector 8 is now able, and by its very characteristics, does, resume its original shape and configuration about the intermediate connector member retaining the integrity of the seal about the connector member 3.

On the other hand the gel 11 disposed within the spring contact 12 which has been engaged by and partly removed by withdrawal of one arm 26 of the crocodile test clip 22 shows a reduced level. With continuous use, the level within the contact 12 may drop considerably, although by means of the invention the gel 11 about the connector member 3 will be sustained providing safe continuing seal of that connector.

Figure 8:
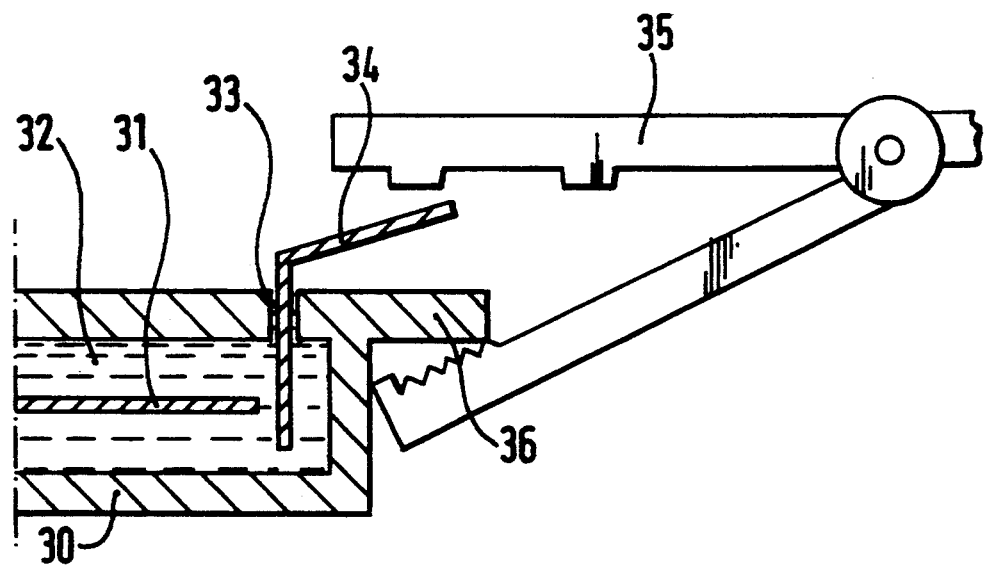
FIG. 8 shows schematically an alternative form of test access position to that shown in FIGS. 5 to 7.
Figure 5:
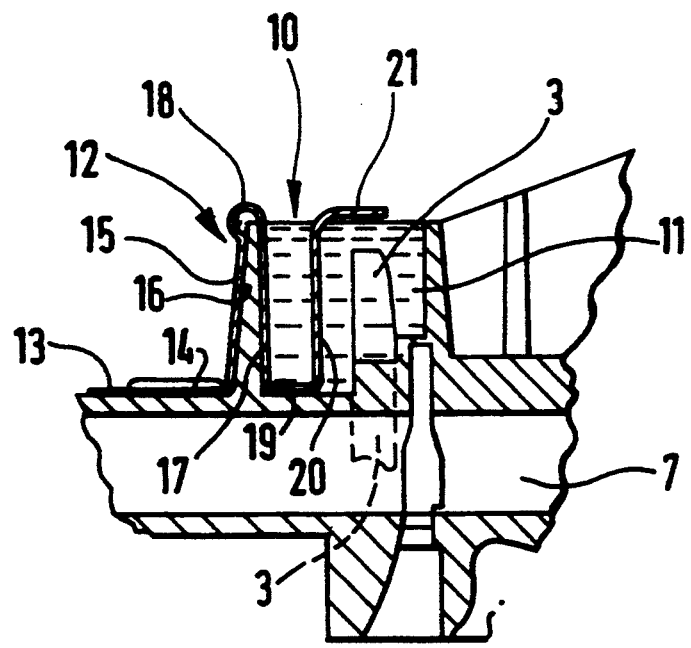
FIG. 5 is a detailed section of part of the connector assembly of FIG. 3 showing a test access position thereof.

FIG. 8 illustrates an alternative form of contact arrangement. In this case a cavity 30 containing a live connector 31 and a gel 32 is provided with an opening 33 into which an angled contact member 34 projects. A spring urged crocodile clip testing probe 35 gripping the wall 36 of the cavity and the contact member 34 moves the member 34 into conductive contact with the connector 31. On release of the clip 35, the resilient nature of the gel returns the contact member 34 to the position indicated in the Figure.

It is to be understood that the foregoing is merely exemplary of wire connector assemblies in accordance with the invention and that modifications can readily be made thereto without departing from the true scope of the invention.

What is claimed is:

1. A transmission wire connector assembly comprising:
    a live connector;
    a recess within a body of the assembly into which the live connector extends, the recess being arranged to contain a non-conductive elastic self-healing sealant gel for providing a seal of the live connector with respect to the environment;
    an electrically conductive contact member arranged to be disposed at least partially within the recess such that the contact member is held in a non-live, non-contact position separated from the live connector, the contact member being so disposed and arranged that upon applying a test probe thereto the contact member is moved into contact with the live connector to enable electrical testing thereof to take place, the contact member being so arranged that upon removal of the test probe, the contact member returns to the non-contact position separated from the live connector; and
    wherein the contact member is angled, wherein the recess is a cavity containing the live connector immersed in the gel, wherein the angled contact member projects from an opening in the cavity, and wherein the test probe includes clip arms for gripping a wall of the cavity and the contact member.

2. An assembly as claimed in claim 1 wherein the contact member is movable into conductive contact with the live connector by the test probe, wherein release of the test probe enables the resilient nature of the gel to return the contact member to the non-contact position.

3. An assembly as claimed in claim 1 wherein the live connector comprises an intermediate connector member.

4. An assembly as claimed in claim 1 wherein the test probe includes a two armed clip.

5. An assembly as claimed in claim 1 wherein testing contact of the test probe of the contact member is by movement of the test probe through the self-healing elastic sealant gel to a side of the contact member remote from the live connector.

6. An assembly as claimed in claim 5 wherein repeated use of the test probe depletes only the gel adjacent to the side of the contact member remote from the live connector, such that the live connector is continually encapsulated and protected by the gel.

7. An assembly as claimed in claim 1 wherein the contact member comprises a strip like member anchored to a wall of the recess and having a generally upright "U" section immersed in the gel, one arm of the contact member lying adjacent to the live connector whereby upon engaging the test probe with the contact member, the arm of the contact member is moved towards and engages the live connector whereby the test probe can perform its test function.

8. An assembly as claimed in claim 7 arranged such that any depletion of the gel by the test probe occurs within the "U" shaped contact member, whereby the gel surrounding the live connector is not depleted by the test probe.

9. An assembly as claimed in claim 7 wherein the contact member is in the form of a spring member fastened to the body of the assembly outside the recess by means of a stud, and having a portion passing up an outer surface of a wall of the recess, and down an inner surface of the wall thereof so as to lie there against, the contact member at the upper edge of the wall being formed into a curve defining a turning position for the spring member, the spring member having a base portion lying within the recess.

10. An assembly as claimed in claim 1 wherein the contact member includes a free upstanding portion, and the live connector is disposed between the free upstanding portion and the wall of the recess, the free upstanding portion and a wall of the recess being contacted by the test probe when the test probe is in use, whereby the upstanding portion is pulled into contact with the live connector, such that the sealant gel between the free upstanding portion and the side wall of the recess thereto is moved by the compression from the probe to protrude out of the recess.

11. An assembly as claimed in claim 10 wherein the free upstanding portion of the contact member is provided with an overlying portion providing a limit to the outward movement of the gel during the use of the probe.

* * * * *